(12) United States Patent
Yang

(10) Patent No.: US 11,646,093 B2
(45) Date of Patent: May 9, 2023

(54) MEMORY SYSTEM AND METHOD OF OPERATING THE SAME

(71) Applicant: SK hynix Inc., Icheon-si Gyeonggi-do (KR)

(72) Inventor: Jae Wook Yang, Icheon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/373,112

(22) Filed: Jul. 12, 2021

(65) Prior Publication Data

US 2022/0238173 A1 Jul. 28, 2022

(30) Foreign Application Priority Data

Jan. 25, 2021 (KR) .................. 10-2021-0010392

(51) Int. Cl.

| | | |
|---|---|---|
| *G06F 12/02* | (2006.01) | |
| *G11C 29/42* | (2006.01) | |
| *G11C 29/44* | (2006.01) | |
| *G11C 16/28* | (2006.01) | |
| *G11C 16/24* | (2006.01) | |
| *G11C 16/16* | (2006.01) | |
| *G11C 16/08* | (2006.01) | |
| *G11C 16/10* | (2006.01) | |

(52) U.S. Cl.
CPC .......... *G11C 29/42* (2013.01); *G06F 12/0253* (2013.01); *G11C 16/08* (2013.01); *G11C 16/107* (2013.01); *G11C 16/16* (2013.01); *G11C 16/24* (2013.01); *G11C 16/28* (2013.01); *G11C 29/4401* (2013.01)

(58) Field of Classification Search
None
See application file for complete search history.

(56) References Cited

U.S. PATENT DOCUMENTS

| | | | | |
|---|---|---|---|---|
| 2016/0293271 | A1* | 10/2016 | Won | G11C 29/12005 |
| 2018/0053565 | A1* | 2/2018 | Kim | G11C 29/08 |
| 2019/0079861 | A1* | 3/2019 | Amaki | G11C 29/42 |
| 2019/0103169 | A1* | 4/2019 | Bang | G11C 29/42 |
| 2020/0401477 | A1* | 12/2020 | Klein | G06F 11/1068 |

FOREIGN PATENT DOCUMENTS

| | | |
|---|---|---|
| KR | 1020190025348 A | 3/2019 |
| KR | 1020190078133 A | 7/2019 |

* cited by examiner

*Primary Examiner* — Cynthia Britt
*Assistant Examiner* — Matthew W Wahlin
(74) *Attorney, Agent, or Firm* — William Park & Associates Ltd.

(57) ABSTRACT

The present technology relates to a memory system and a method of operating the same. The memory system includes a memory device including a plurality of semiconductor memories, and a controller configured to control the memory device to select a victim block based on a fail bit number of some data, among data that is programmed in each of the plurality of semiconductor memories, corresponding to a specific program state, and configured to perform a garbage collection operation on the selected victim blocks.

17 Claims, 11 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2021-0010392, filed on Jan. 25, 2021, in the Korean Intellectual Property Office, the entire disclosure of which is incorporated herein by reference.

BACKGROUND

1. Technical Field

The present disclosure relates to a memory system and a method of operating the same, and more particularly, to a memory system capable of improving reliability of data and a method of operating the same.

2. Related Art

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally uses a memory system that uses a memory device, that is, a data storage device. The data storage device is used as a main storage device or an auxiliary storage device of the portable electronic device.

The data storage device using the memory device has advantages that stability and durability are excellent because there is no mechanical driver, an access speed of information is very fast, and power consumption is low. As an example of the memory system with such advantages, a data storage device includes a universal serial bus (USB) memory device, a memory card with various interfaces, a solid state drive (SSD), and the like.

SUMMARY

According to an embodiment of the present disclosure, a memory system includes a memory device including a plurality of semiconductor memories, and a controller configured to control the memory device to select a victim block based on a fail bit number of some data, among data that is programmed in each of the plurality of semiconductor memories, corresponding to a specific program state, and configured to perform a garbage collection operation on the selected victim blocks.

According to an embodiment of the present disclosure, a method of operating a memory system includes reading data that is stored in a memory block, performing a fail bit check operation that detects a fail bit of some data, among the read data, corresponding to a specific program state, and counting a fail bit number, selecting the memory block as a victim block when the fail bit number is greater than or equal to a set number, and performing a garbage collection operation on the selected victim block.

According to an embodiment of the present disclosure, a method of operating a memory system includes reading data of memory cells, among memory cells that are included in a memory block, programmed to a specific program state, performing a fail bit check operation that counts the number of read data and counts a fail bit number by comparing the number of counted data with a reference number, selecting the memory block as a victim block when the fail bit number is greater than or equal to a set number, and performing a garbage collection operation on the selected victim block.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure will be described with reference to the accompanying drawings in order to describe in detail enough to allow those of ordinary skill in the art to easily implement the technical idea of the present disclosure.

An embodiment of the present disclosure provides a memory system performing a garbage collection operation based on the number of fail bits of memory cells, and a method of operating the memory system.

According to the present technology, reliability of data may be improved by performing a fail bit check operation on some data of which a low temperature data retention (LTDR) characteristic is relatively weak at a regular period interval and performing a garbage collection operation based on a result of the fail bit check operation.

Figure 1:
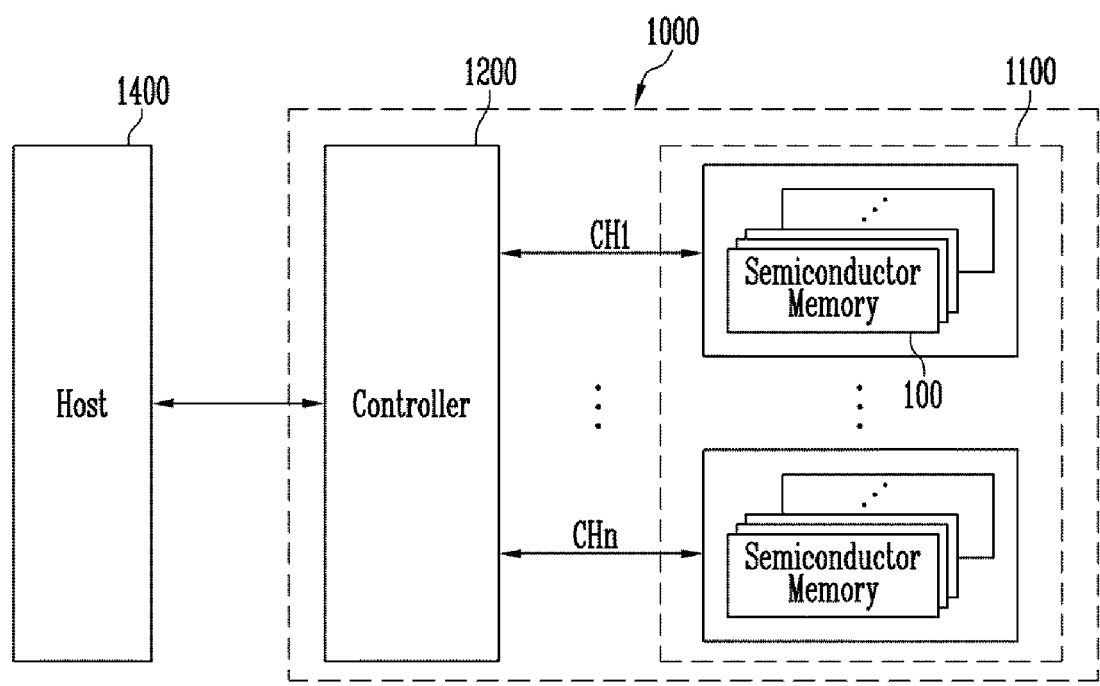
FIG. 1 is a block diagram illustrating a memory system according to an embodiment of the present disclosure.

FIG. 1 is a block diagram illustrating a memory system according to an embodiment of the present disclosure.

Referring to FIG. 1, the memory system 1000 may include a memory device 1100 and a controller 1200.

The memory device 1100 may include a plurality of semiconductor memories 100. The plurality of semiconductor memories 100 may be divided into a plurality of groups.

The plurality of semiconductor memories 100 may include a plurality of memory blocks that are capable of storing data, and at least one memory block, among the plurality of memory blocks, may be used as a content addressable memory (CAM) block. In an embodiment, the CAM block may store information regarding a program completion time of the memory blocks that are included in a corresponding semiconductor memory.

In FIG. 1, the plurality of groups may communicate with the controller 1200 through first to n-th channels CH1 to CHn, respectively. Each semiconductor memory 100 is described later with reference to FIG. 3.

Each group may be configured to communicate with the controller 1200 through one common channel. The controller 1200 may be configured to control the plurality of semiconductor memories 100 of the memory device 1100 through the plurality of channels CH1 to CHn.

The controller 1200 may be connected between a host 1400 and the memory device 1100. The controller 1200 may configured to access the memory device 1100 in response to a request from the host 1400. For example, the controller 1200 may be configured to control the read, write, erase, and background operations of the memory device 1100 in response to the request that is received from the host 1400. The controller 1200 may be configured to provide an interface between the memory device 1100 and the host 1400. The controller 1200 may be configured to drive firmware that controls the memory device 1100. In addition, the controller 1200 may perform a fail bit check operation of each of the plurality of semiconductor memories 100 of the memory device 1100 every set period and may control a garbage collection operation of each of the plurality of semiconductor memories 100 based on a result of the fail bit check operation. The garbage collection operation may be an operation that selects at least one victim block, storing valid data, from among the plurality of memory blocks that are included in the semiconductor memory 100, copying only the valid data among data that is stored in the selected victim block, storing the valid data in a target block, in an erase state, among the plurality of memory blocks, and then erasing the selected victim block.

The above-described memory system 1000 may further include a buffer memory.

The host 1400 may control the memory system 1000. The host 1400 may include a portable electronic device such as a computer, a PDA, a PMP, an MP3 player, a camera, a camcorder, and a mobile phone. The host 1400 may request a write operation, a read operation, an erase operation, and the like of the memory system 1000 through a command.

In an embodiment of the present disclosure, the controller 1200 may control the memory device 1100 to perform the fail bit check operation when the set period is reached. In another embodiment of the present disclosure, each of the plurality of semiconductor memories 100 may select memory blocks of which the set time has elapsed after completion of the program based on the information regarding the program completion time of the memory blocks that are stored in the CAM block, and the controller 1200 may control the memory device 1100 to perform the fail bit check operation on the selected memory blocks.

In an embodiment of the present disclosure, during the fail bit check operation, the controller 1200 may detect a fail bit of read data, among read data that is received from each of the plurality of semiconductor memories 100, corresponding to a specific program state, and may count the number of detected fail bits. In another embodiment of the present disclosure, during the fail bit check operation, each of the semiconductor memories 100 may read data, among the data that is stored in the selected memory block, corresponding to a specific program state by performing a read operation by using a read voltage that corresponds to the specific program state and may count the number of fail bits by comparing the number of read data to a set number. That is, in an embodiment of the present disclosure, the controller 1200 may detect and count the fail bit, included in the read data, received from the plurality of semiconductor memories 100, and in another embodiment of the present disclosure, each of the plurality of semiconductor memories 100 may read the data from the selected memory block and count the number of fail bits that are included in the read data.

The controller 1200 and the memory device 1100 may be integrated into one semiconductor device. As an exemplary embodiment, the controller 1200 and the memory device 1100 may be integrated into one semiconductor device to form a memory card. For example, the controller 1200 and the memory device 1100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash memory (UFS).

The controller 1200 and the memory device 1100 may be integrated into one semiconductor device to form a semiconductor drive (solid state drive (SSD)). The semiconductor drive (SSD) may include a storage device configured to store data in a semiconductor memory. When the memory system 1000 is used as the semiconductor drive (SSD), an operation speed of the host 1400 connected to the memory system 1000 may be dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an exemplary embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 2:
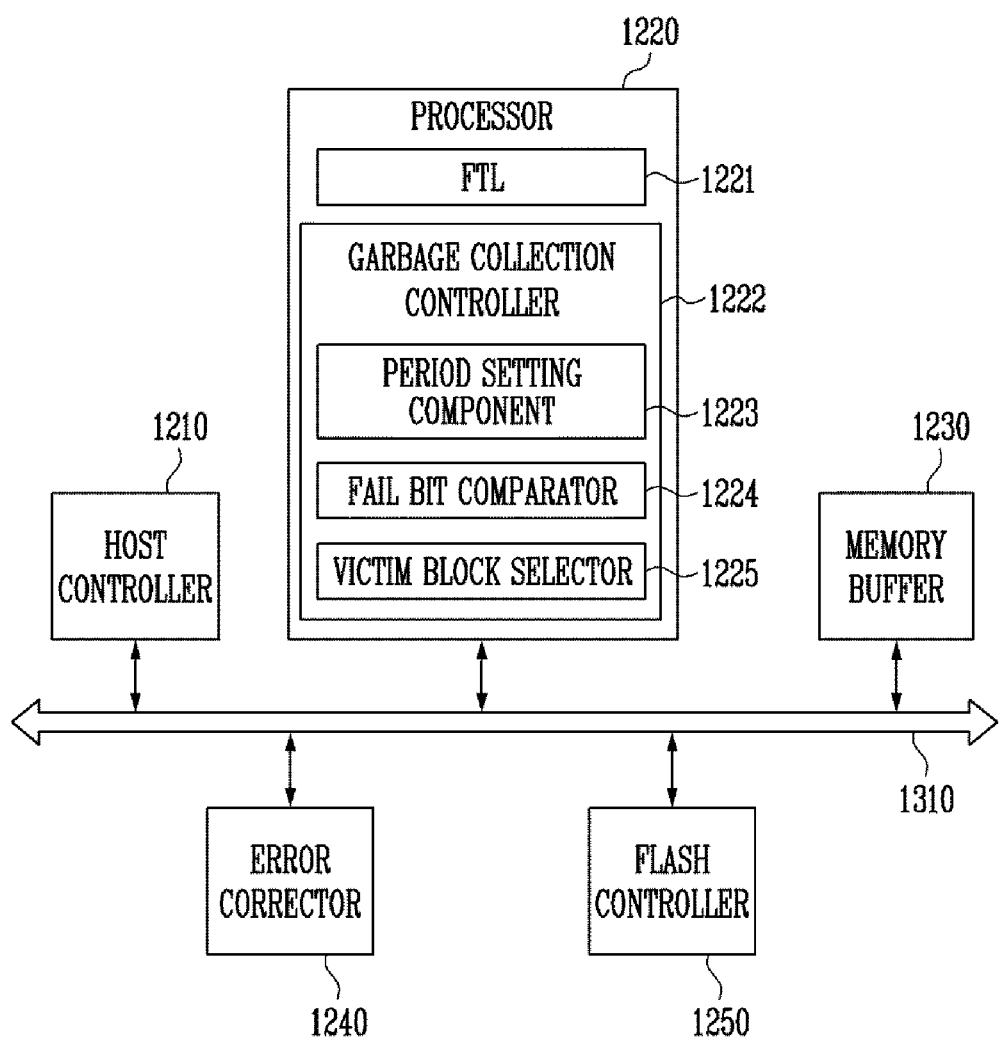
FIG. 2 is a block diagram illustrating a configuration of a controller of FIG. 1.

FIG. 2 is a block diagram illustrating a configuration of the controller of FIG. 1.

Referring to FIG. 2, the controller 1200 may include a host controller 1210, a processor 1220, a memory buffer 1230, an error corrector 1240, a flash controller 1250, and a bus 1310.

The bus 1310 may be configured to provide a channel between components of the controller 1200.

The host controller 1210 may control data transmission between the host 1400 of FIG. 1 and the memory buffer 1230. As an example, the host controller 1210 may control an operation of buffering data input from the host 1400 to the memory buffer 1230. As another example, the host controller 1210 may control an operation of outputting the data that is buffered in the memory buffer 1230 to the host 1400. The host controller 1210 may include a host interface.

The processor 1220 may control an overall operation of the controller 1200 and may perform a logical operation. The processor 1220 may communicate with the host 1400 of FIG. 1 through the host controller 1210 and communicate with the memory device 1100 of FIG. 1 through the flash controller 1250. In addition, the processor 1220 may control the memory buffer 1230. The processor 1220 may control an operation of the memory system 1000 by using the memory buffer 1230 as an operation memory, a cache memory, or a buffer memory.

The processor 1220 may include a flash translation layer (FTL, hereinafter referred to as "FTL") 1221 and a garbage collection controller 1222.

The FTL 1221 may drive firmware that is stored in the memory buffer 1230. In addition, the FTL 1221 may map a physical address that corresponds to a logical address that is input from the host 1400 of FIG. 1 during a data write operation. In addition, the FTL 1221 may check the physical address that is mapped to the logical address that is input from the host 1400 during a data read operation.

The garbage collection controller 1222 may detect memory blocks, among the memory blocks that are included in each of the plurality of semiconductor memories 100, in which the number of fail bits is equal to or greater than a set number after completion of the program, and may select the detected memory blocks as a victim block of the garbage collection operation. The garbage collection controller 1222 may control the plurality of semiconductor memories 100 to perform the garbage collection operation on the selected victim block.

The garbage collection controller 1222 may include a period setting component 1223, a fail bit comparator 1224, and a victim block selector 1225.

The period setting component 1223 may set a period in which the fail bit check operation is performed and may control the memory device 1100 of FIG. 1 to perform the fail bit check operation in each set period. For example, the period setting component 1223 may set a time until a low temperature data retention (LTDR) characteristic of the memory cells on which the program operation is completed deteriorates as the period in which the fail bit check operation is performed. For example, the period setting component 1223 may set one month, three months, or six months as the period in which the fail bit check operation is performed.

In an embodiment, the fail bit comparator 1224 compares the number of fail bits of the data corresponding to the specific program state among the data read from the selected memory block received from the error corrector 1240 with the set number during the fail bit check operation.

In another embodiment, the fail bit comparator 1224 may receive the fail bit number of the data that corresponds to the specific program state that is stored in the memory blocks from the plurality of semiconductor memories 100 of FIG. 1 and may compare the received fail bit number with the set number.

The fail bit comparator 1224 may compare the fail bit number corresponding to the memory blocks with the set number and output information regarding the memory blocks in which the fail bit number that is greater than the set number is detected.

The victim block selector 1225 may receive the information regarding the memory blocks in which the fail bit number that is greater than the set number is detected from the fail bit comparator 1224, and may select the memory blocks in which the fail bit number that is greater than the set number is detected as the victim block of the garbage collection operation.

The memory buffer 1230 may be used as an operation memory, a cache memory, or a buffer memory of the processor 1220. The memory buffer 1230 may store codes and commands that are executed by the processor 1220. The memory buffer 1230 may store data that is processed by the processor 1220. The memory buffer 1230 may include a static RAM (SRAM) or a dynamic RAM (DRAM). The memory buffer 1230 may store a command queue that is generated by the processor 1220.

The error corrector 1240 may perform error correction. The error corrector 1240 may perform an error correction encoding (ECC encoding) based on data to be written to the memory device 1100 of FIG. 1 through the flash controller 1250. The error correction encoded data may be transferred to the memory device 1100 through the flash controller 1250. The error corrector 1240 may perform error correction decoding (ECC decoding) on data that is received from the memory device 1100 through the flash controller 1250. For example, the error corrector 1240 may be included in the flash controller 1250 as a component of the flash controller 1250.

In an embodiment, during the fail bit check operation, the error corrector 1240 may receive the read data from the memory device 1100 of FIG. 1, detect the fail bit of the data, among the received data, corresponding to the specific program state, and count the number of detected fail bits. The specific program state may be a program state in which the LTDR characteristic is relatively weak and may be a program state in which a threshold voltage distribution is relatively high among a plurality of program states.

The flash controller 1250 may generate and output an internal command that controls the memory device 1100 in response to a command queue that is generated by the processor 1220. The flash controller 1250 may control an operation of transmitting and programming the data that is buffered in the memory buffer 1230 to the memory device 1100 during the data write operation. As another example, the flash controller 1250 may control an operation of buffering the data that is read from the memory device 1100 and output to the memory buffer 1230 in response to the command queue during the read operation. The flash controller 1250 may include a flash interface.

Figure 3:
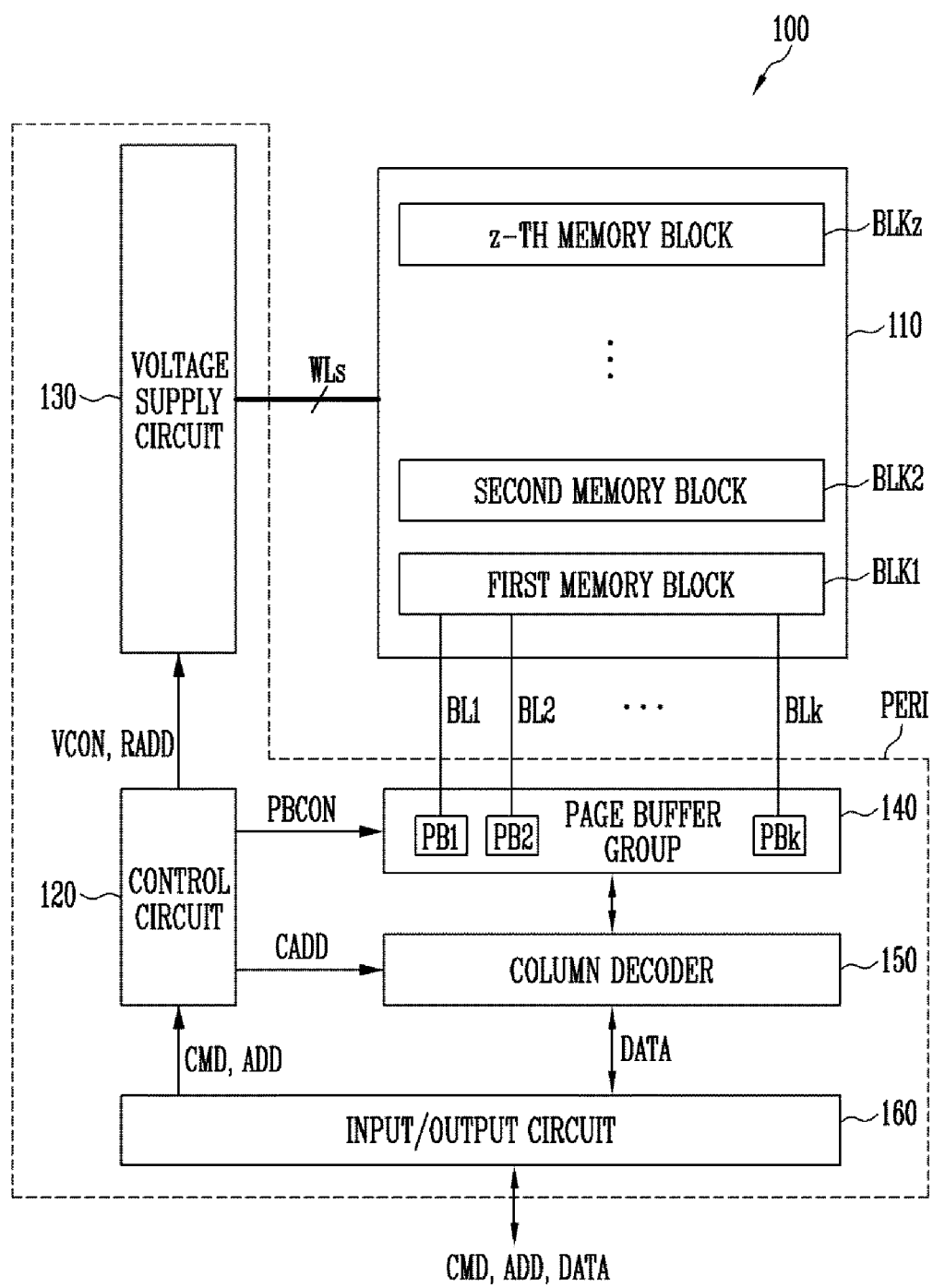
FIG. 3 is a block diagram illustrating a semiconductor memory of FIG. 1.

FIG. 3 is a block diagram illustrating the semiconductor memory of FIG. 1.

Referring to FIG. 3, the semiconductor memory 100 may include a memory cell array 110 that includes a plurality of memory blocks BLK1 to BLKz. The semiconductor memory 100 may also include a peripheral circuit PERI configured to perform a program operation, a read operation, or an erase operation of memory cells that are included in a selected page of the plurality of memory blocks BLK1 to BLKz. The peripheral circuit PERI may include a control circuit 120, a voltage supply circuit 130, a page buffer group 140, a column decoder 150, and an input/output circuit 160.

The memory cell array 110 may include the plurality of memory blocks BLK1 to BLKz. Each of the plurality of memory blocks BLK1 to BLKz may include a plurality of pages. Each of the plurality of pages may include a plurality of memory cells. In an embodiment, the plurality of memory cells may be nonvolatile memory cells. Each of the memory cells may be configured as a multi-level cell (MLC) that is capable of storing two data bits, a triple level cell (TLC) that is capable of storing three data bits, a quad level cell (QLC) that is capable of storing four data bits, or a penta level cell (PLC) that is capable of storing five data bits. In an embodiment, at least one memory block BLK1, among the plurality of memory blocks BLK1 to BLKz, may be used as a CAM block. The CAM block may store information regarding a program completion time of each of the memory blocks BLK1 to BLKz that are included in the semiconductor memory 100.

The control circuit 120 may output a voltage control signal VCON for generating a voltage that is required to perform the read operation, the program operation, or the erase operation in response to a command CMD that is input from an external device through the input/output circuit 160 and may output a PB control signal PBCON for controlling page buffers PB1 to PBk that are included in the page buffer group 140 based on the type of operation. In addition, the control circuit 120 may output a row address signal RADD and a column address signal CADD in response to an address signal ADD that is input from an external device through the input/output circuit 160.

In an embodiment, during the fail bit check operation, the control circuit 120 may control the peripheral circuit PERI to read data that is stored in pages that correspond to a weak word line or all word lines of the selected memory block and transmit the read data to the controller 1200 of FIG. 1.

In another embodiment, during the fail bit check operation, the control circuit 120 may control the peripheral circuit PERI to read data, corresponding to a specific program state, among data that is stored in pages that correspond to the weak word line or the all word lines of the selected memory block. The specific program state may be at least one program state, among a plurality of program states, of which a threshold voltage distribution is relatively high based on a threshold voltage distribution of the memory cell. The control circuit 120 may compare the number of data that correspond to the specific program state with a set number. When the number of data that correspond to the specific program state is less than the set number, the control circuit 120 may transmit a difference value between the number of data that corresponds to the specific program state and the set number to the controller 1200 of FIG. 1 as the fail bit number.

The control circuit 120 may control the peripheral circuit PERI to program valid data that is stored in the selected memory block, that is, the victim block, among the plurality of memory blocks, to a memory block of an erase state, that is, a target block, during the garbage collection operation. The control circuit 120 may control the peripheral circuit PERI to erase the victim block when the program operation of the target block is completed. In more detail, during the garbage collection operation, the control circuit 120 may control the peripheral circuit PERI to read the valid data that is stored in the victim block and transmit the valid data to the controller 1200 of FIG. 1. The control circuit 120 may control the peripheral circuit PERI to receive the valid data from the controller 1200 and program the valid data to the target block. The valid data that is received from the controller 1200 may be data on which the error correction operation is performed by the error corrector 1240 of FIG. 2. The control circuit 120 may control the peripheral circuit PERI to erase the victim block during the program operation on the target block or after the program operation is completed.

In response to the voltage control signal VCON of the control circuit 120, the voltage supply circuit 130 may supply operation voltages that are required for the program operation, the read operation, and the erase operation of the memory cells to local lines that include a drain select line, word lines WLs, and a source select line of the selected memory block. The voltage supply circuit 130 may include a voltage generation circuit and a row decoder.

The voltage generation circuit may output the operation voltages that are required for the program operation, the read operation, and the erase operation of the memory cells to global lines in response to the voltage control signal VCON of the control circuit 120.

In response to the row address signals RADD of the control circuit 120, the row decoder may connect the global lines and the local lines so that the operation voltages that are output to the global lines from the voltage generation circuit may be transferred to the local lines of the selected memory block in the memory cell array 110.

The page buffer group 140 may include the plurality of page buffers PB1 to PBk that are connected to the memory cell array 110 through bit lines BL1 to BLk, respectively. The page buffers PB1 to PBk of the page buffer group 140 may selectively precharge the bit lines BL1 to BLk according to data DATA that is input to be stored in the memory cells in response to the PB control signal PBCON of the control circuit 120 or may sense a voltage or a current amount of the bit lines BL1 to BLk to read the data DATA from the memory cells.

The column decoder 150 may select the page buffers PB1 to PBk that are included in the page buffer group 140 in response to the column address signal CADD output from the control circuit 120. That is, the column decoder 150 may sequentially transfer the data DATA, which is to be stored in the memory cells, to the page buffers PB1 to PBk in response to the column address signal CADD. In addition, the page buffers PB1 to PBk may be sequentially selected in response to the column address signal CADD so that the data DATA of the memory cells that are latched in the page buffers PB1 to PBk may be output to an external device by the read operation.

The input/output circuit 160 may transfer the data DATA that is input to be stored in the memory cells during the program operation to the column decoder 150 based on the control circuit 120 in order to input the data DATA to the page buffer group 140. When the column decoder 150 transfers the data DATA, which is transferred from the input/output circuit 160, to the page buffers PB1 to PBk of the page buffer group 140, the page buffers PB1 to PBk may store the input data DATA in an internal latch circuit. In addition, during the read operation, the input/output circuit 160 may output the data DATA, which is transferred from the page buffers PB1 to PBk of the page buffer group 140 through the column decoder 150, to an external device.

Figure 4:
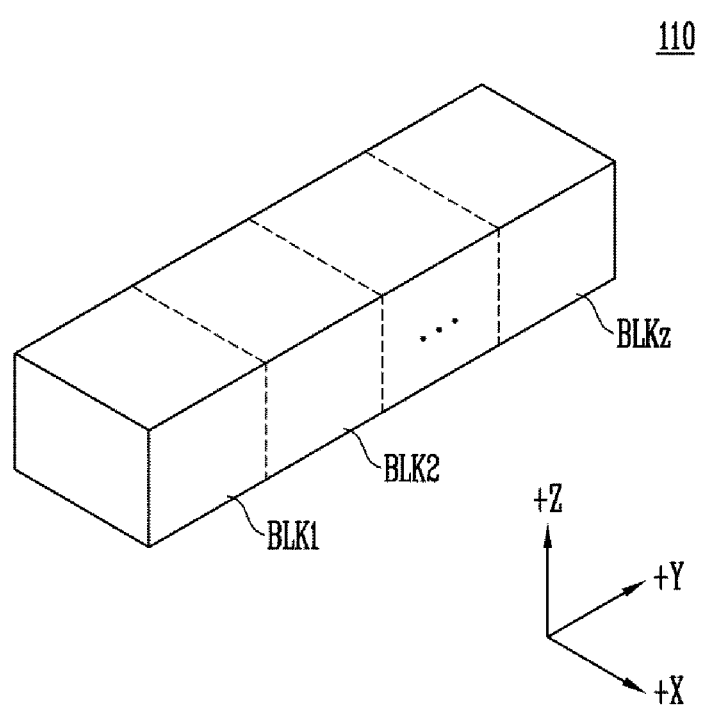
FIG. 4 is a block diagram illustrating an embodiment of a memory cell array of FIG. 3.

FIG. 4 is a block diagram illustrating an embodiment of the memory cell array of FIG. 3.

Referring to FIG. 4, the memory cell array 110 may include the plurality of memory blocks BLK1 to BLKz. Each memory block may have a three-dimensional structure. Each memory block may include a plurality of memory cells stacked on a substrate. The plurality of memory cells may be arranged along a +X direction, a +Y direction, and a +Z direction. The structure of each memory block is described in more detail with reference to FIG. 5.

Figure 5:
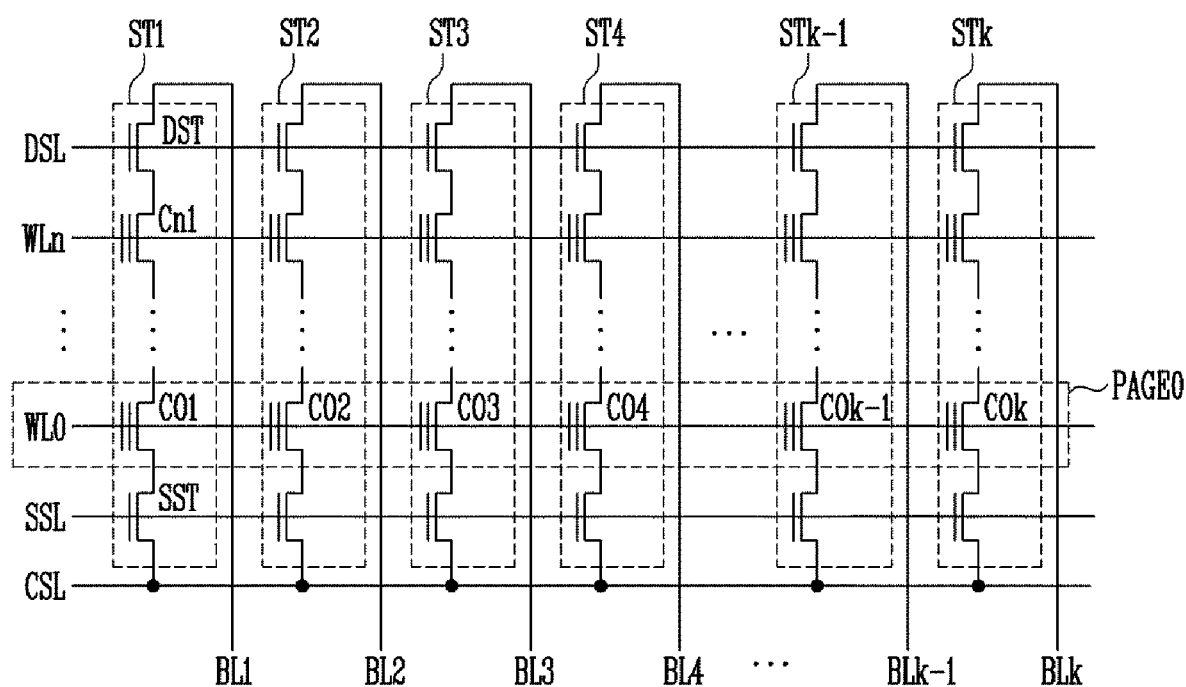
FIG. 5 is a circuit diagram illustrating a memory block shown in FIG. 4.

FIG. 5 is a circuit diagram illustrating the memory block shown in FIG. 4.

Referring to FIG. 5, each memory block may include a plurality of strings ST1 to STk that are connected between the bit lines BL1 to BLk and a common source line CSL. That is, the strings ST1 to STk may be respectively connected to the corresponding bit lines BL1 to BLk and may be commonly connected to the common source line CSL. Each string ST1 may include a source select transistor SST with a source that is connected to the common source line CSL, a plurality of memory cells C01 to Cn1, and a drain select transistor DST with a drain that is connected to the bit line BL1. The memory cells C01 to Cn1 may be connected in series between the select transistors SST and DST. The gate of the source select transistor SST may be connected to a source select line SSL, gates of the memory cells C01 to Cn1 may be connected to word lines WL0 to WLn, respectively, and the gate of the drain select transistor DST may be connected to a drain select line DSL.

The memory cells that are included in the memory block may be divided into a physical page unit or a logical page unit. For example, the memory cells C01 to C0k that are connected to one word line (for example, WL0) may configure one physical page PAGE0.

Figure 6A:
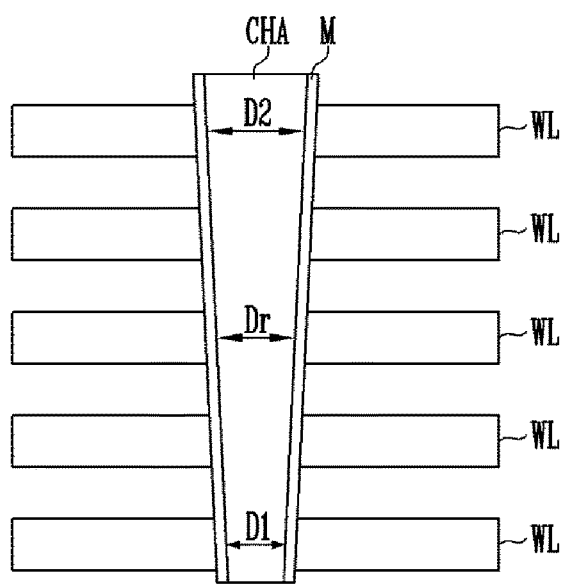
FIGS. 6A and 6B are cross-sectional views illustrating a structure of a memory block of FIG. 3.
Figure 6B:
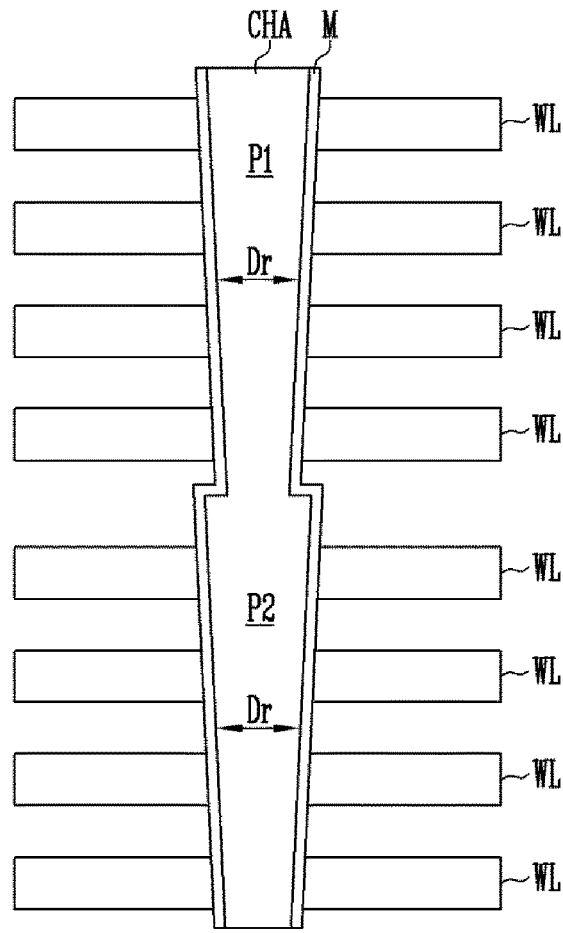

FIGS. 6A and 6B are cross-sectional views illustrating a structure of the memory block of FIG. 3.

Referring to FIG. 6A, a plurality of word lines WL may be stacked. Here, the word lines WL may include a conductive material, such as polysilicon or tungsten. In addition, the word lines WL and insulating layers (not shown) may be alternately stacked.

A channel layer CHA may pass through the plurality of word lines WL, and memory cells may be positioned in a region in which the channel layer CHA and the word lines WL cross each other. Therefore, the plurality of memory cells may be stacked along the channel layer CHA.

In addition, the memory layer M may be interposed between the channel layer CHA and the word lines WL. Here, the memory layer M may be formed to surround a sidewall of the channel layer CHA. Therefore, the stacked memory cells may share the memory layer M. In addition, the memory layer M may include a space region that corresponds to a region between the stacked word lines WL.

A method of manufacturing the above-described memory block is briefly described as follows. First, after forming a stack including alternately stacked first material layers and second material layers, an opening that passes through the stack may be formed. Subsequently, the memory layer M and the channel layer CHA may be formed in the opening. Here, the channel layer CHA may have an opened center region or may have a structure that is completely filled to the center region. When the channel layer CHA has the opened center region, a gap fill layer may be filled in the center region. Subsequently, the first material layers may be replaced with third material layers (for example, a metal layer, a silicide layer, or an insulating layer). For example, the first material layers with a sacrificial material, such as nitride, may be replaced with the third material layers that include metal, and the third material layers may be the word lines WL.

According to the manufacturing method, since the opening is formed by using an etching process, the opening may have a narrower width towards the lower portion due to the limitation of the etching process. Therefore, the diameter of the channel layer CHA that is formed in the opening also decreases towards the lower portion. In the case of a memory cell of a gate all around (GAA) structure in which a gate electrode surrounds the sidewall of the channel layer, a diameter change of the channel layer CHA may have different characteristics for the memory cell. For example, a channel layer diameter D1 of the memory cells corresponding to the word line WL that is positioned at the lowermost portion among the plurality of word lines may be less than a reference value Dr, and a channel layer diameter D2 of the memory cells that corresponds to the word line WL that is positioned at the uppermost portion among the plurality of word lines may be greater than the reference value Dr. Accordingly, the memory cells that correspond to the word lines WL that is positioned at the uppermost portion and the lowermost portion may have a slower or faster program speed compared to other memory cells, and the LTDR characteristic may be liable to be deteriorated due to a program speed deviation. Accordingly, in an embodiment of the present disclosure, word lines that are connected to memory cells, in which a channel layer diameter is less than the reference value Dr by a set value or more than the set value or the channel layer diameter is greater than the reference value Dr by the set value or more than the set value, may be selected as the weak word line, and data of the memory cells that correspond to the weak word line may be read during the fail bit check operation.

Referring to FIG. 6B, the channel layer CHA may include a plurality of pillars P1 and P2, and each of the pillars P1 and P2 may have a cross section of a tapered shape. In such a case, in each of the pillars P1 and P2, a lower portion may have a width that is narrower than that of an upper portion. The lower end of the upper pillar P1 may have a width that is narrower than that of an upper end of the lower pillar P2 in a portion at which the upper pillar P1 and the lower pillar P2 are connected. Therefore, the word line that is connected to the memory cells, in which the diameter of the channel layer is greater than the reference value Dr by the set value or more than the set value or the diameter of the channel layer is less than the reference value Dr by the set value or more than the set value, may be selected as the weak word line, by comparing the diameter of the channel layer CHA and the reference value Dr in each of the pillars P1 and P2.

Figure 7:
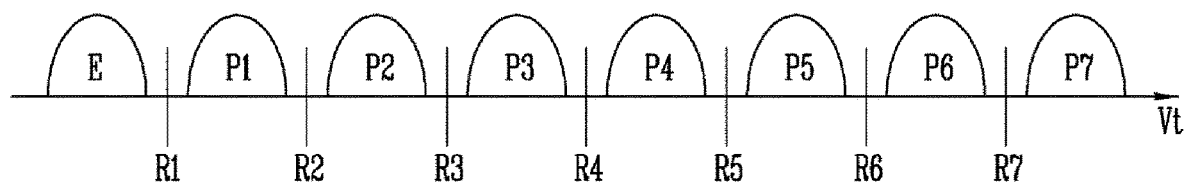
FIG. 7 is a threshold voltage distribution diagram illustrating a threshold voltage distribution of memory cells.

FIG. 7 is a threshold voltage distribution diagram illustrating a threshold voltage distribution of memory cells.

Referring to FIG. 7, the triple level cell may have threshold voltage states that correspond to one erase state E and seven program states P1 to P7, respectively. The erase state E and the first to seventh program states P1 to P7 may have corresponding bit codes. Various bit codes may be assigned to the erase state E and the first to seventh program states P1 to P7 as necessary.

For example, a bit code of 1/1/1 may be assigned to LSB/CSB/MSB in the erase state E, a bit code of 1/1/0 may be assigned to LSB/CSB/MSB in the first program state P1, a bit code of 1/0/0 may be assigned to LSB/CSB/MSB in the second program state P2, a bit code of 0/0/0 may be assigned to LSB/CSB/MSB in the third program state P3, a bit code of 0/1/0 may be assigned to LSB/CSB/MSB in the fourth program state P4, a bit code of 0/1/1 may be assigned to LSB/CSB/MSB in the fifth program state P5, a bit code of 0/0/1 may be assigned to LSB/CSB/MSB in the sixth program state P6, and a bit code of 1/0/1 may be assigned to LSB/CSB/MSB in the seventh program state P7.

Each of threshold voltage states may be divided based on first to seventh read voltages R1 to R7.

The LTDR characteristic may be highly likely to be deteriorated as the threshold voltage distribution of the memory cell is relatively high. Therefore, in an embodiment of the present disclosure, the seventh program state P7 with a relatively high threshold voltage distribution among the erase state E and the plurality of program states P1 to P7 of the TLC may be selected as the specific program state. That is, during a fail bit check operation, the fail bit may be detected by reading data that corresponds to the specific program state with the relatively high threshold voltage distribution.

In the above description, selecting the specific program state of the TLC is described as an example, but this is exemplary. In the case of the QLC, two program states with a relatively high threshold voltage distribution may be selected as the specific program state, and in the case of the PLC, three program states with a relatively high threshold voltage distribution may be selected as the specific program state.

Figure 8:
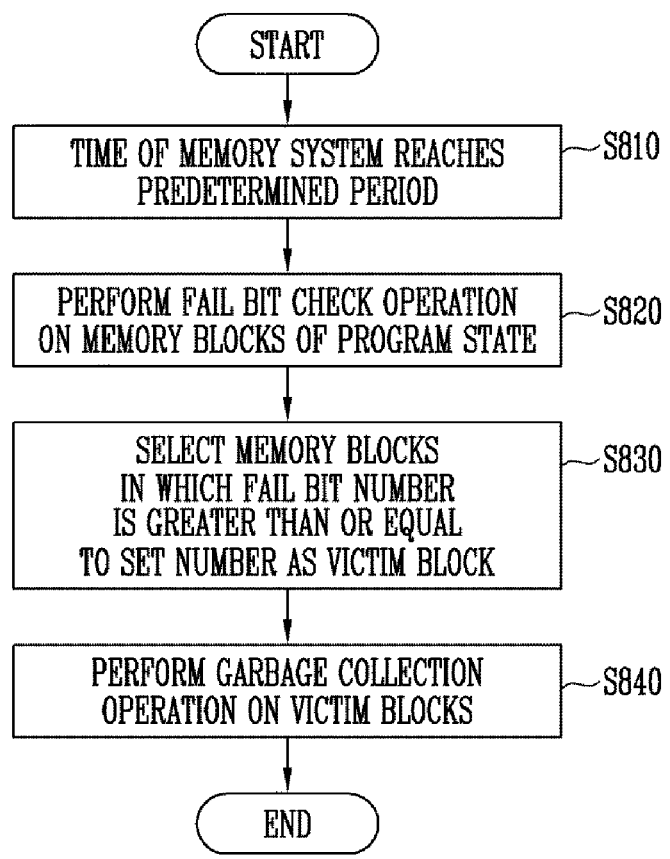
FIG. 8 is a flowchart illustrating a method of operating a memory system according to an embodiment of the present disclosure.

FIG. 8 is a flowchart illustrating a method of operating a memory system according to an embodiment of the present disclosure.

The method of operating the memory system according to an embodiment of the present disclosure is described with reference to FIGS. 1 to 8 as follows.

In an embodiment of the present disclosure, the case in which the memory cells that are included in the plurality of semiconductor memories 100 of the memory device 1100 are programmed through a TLC method is described as an example.

The memory cells that are included in at least one page, corresponding to one word line of a program-completed memory block, may store data that corresponds to one of the erase state E and the plurality of program states P1 to P7. In addition, during the program operation, the semiconductor memory 100 may program data in a random data program method. In this case, among the memory cells that are included in at least one page that corresponds to one word line, the number of memory cells to be programmed to each of the erase state E and the plurality of program states P1 to P7 may be equal to each other. That is, ⅛ of the memory cells that are included in one page may be programmed to the seventh program state P7, which is the specific program state.

In step S810, it is determined whether a predetermined period has been reached for the memory system 1000. For example, the garbage collection controller 1222 of the controller 1200 may determine whether the period set by the period setting component 1223 has been reached.

In step S820, when it is determined that the time of the memory system 1000 has reached the set period in step S810, the fail bit check operation may be performed on the memory blocks that are in a program state, in which the program operation has been performed, among the plurality of memory blocks BLK1 to BLKz that are included in each of the plurality of semiconductor memories 100 of the memory device 1100.

For example, the controller 1200 may receive the data that is stored in the pages that correspond to the weak word line of the memory blocks in the program state from the plurality of semiconductor memories 100, may detect the fail bit of the data that corresponds to the specific program state among the received data, and may count the fail bit number.

For example, each of the plurality of semiconductor memories 100 of the memory device 1100 may read the data that corresponds to the specific program state among the data that is stored in the pages that corresponds to the weak word line of the memory blocks in the program state, and transmit the difference value between the number of read data and the set number as the fail bit number to the controller 1200.

In step S830, the controller 1200 may select the memory blocks in which the fail bit number is greater than or equal to the set number as the victim block. For example, the fail bit comparator of the controller 1200 may compare the fail bit number that corresponds to the memory blocks in the program state with the set number and output information regarding the memory blocks in which the fail bit number that is greater than the set number is detected. The victim block selector 1225 may receive the information regarding the memory blocks in which the fail bit number that is greater than the set number is detected from the fail bit comparator 1224 and may select the memory blocks in which the fail bit number that is greater than the set number is detected as the victim block of the garbage collection operation.

In step S840, the garbage collection operation on the memory blocks that are selected as the victim block may be performed. For example, the memory device 1100 reads the valid data that is stored in the memory blocks selected as the victim block and transmits the valid data to the controller 1200. After performing an error correction operation on the received valid data, the controller 1200 transmits data to a selected semiconductor memory including a memory block selected as a target block among the plurality of semiconductor memories 100. The selected semiconductor memory may program the data that is received from the controller 1200 to the target block. Thereafter, the semiconductor memories 100 may erase the victim block.

Thereafter, when the time of the memory system 1000 reaches the set period again, the operation may be performed again from the above-described step S810.

In the above-described embodiment, an embodiment in which the fail bit check operation is performed every predetermined period of the memory system and the garbage collection operation is performed based on a result of the fail bit check operation is described, but is not limited thereto. For example, the fail bit check operation on the corresponding memory block may be performed after a set time (for example, one month, three months, or six months) has elapsed after the program of the memory block is completed based on the information regarding the program completion time of the memory blocks included in the semiconductor memory stored in the CAM block of the semiconductor memory, and the garbage collection operation may be performed based on the result of the fail bit check operation.

As described above, in an embodiment of the present disclosure, among the data that is programmed to the page corresponding to the weak word line, the fail bit of the data corresponding to the specific program state in which the LTDR characteristic is weak may be checked, and the garbage collection operation may be performed according to a check result. Accordingly, reliability of data that is programmed to the memory device 1100 may be improved.

Figure 9:
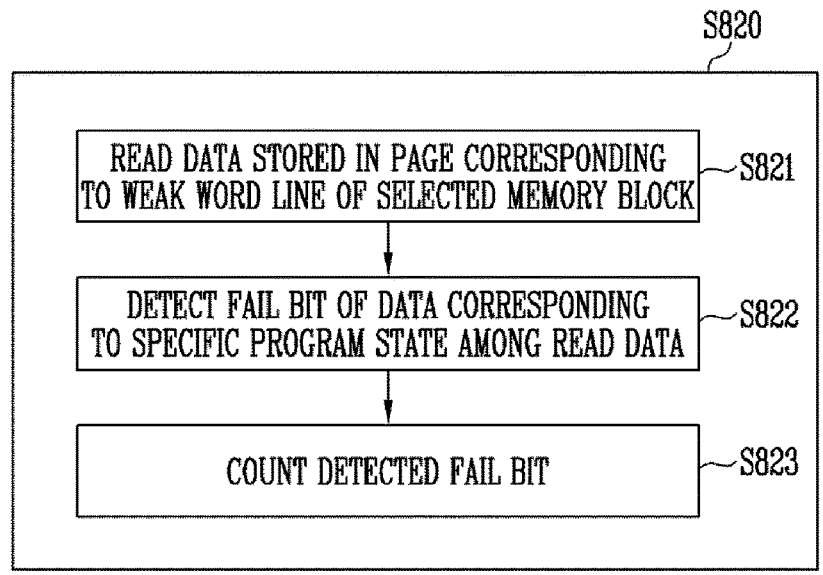
FIG. 9 is a flowchart illustrating an embodiment of step S820 of FIG. 8.

FIG. 9 is a flowchart illustrating an embodiment of step S820 of FIG. 8.

An embodiment of step S820 is described in more detail with reference to FIGS. 1 to 7 and 9 as follows.

In step S821, each of the plurality of semiconductor memories 100 that is included in the memory device 1100 may read the data that is stored in the page that corresponds to the weak word line of the memory blocks in the program state in which the program operation is performed among the plurality of memory blocks BLK1 to BLKz. As shown in FIG. 6A or 6B, the weak word line may be the word line that is connected to the memory cells in which the channel layer diameter of the memory cells is less than the reference value Dr by the set value or more than the set value or the channel layer diameter of the memory cells is greater than the reference value Dr by the set value or more than the set value. The read data may be transmitted to the controller 1200.

In step S822, the fail bit of the data, among the data that is read from the plurality of semiconductor memories 100, corresponding to the specific program state (for example, P7) may be detected.

For example, the flash controller 1250 of the controller 1200 may receive the data from the plurality of semiconductor memories 100 and may transmit the data to the error corrector 1240. The error corrector 1240 may perform error correction decoding (ECC decoding) on the data that is received through the flash controller 1250. For example, the error corrector 1240 may receive the data that is read from the plurality of semiconductor memories 100 through the flash controller 1250 and may detect the fail bit of the data, among the received data, corresponding to the specific program state P7.

In step S823, the error corrector 1240 may count the number of detected fail bits of the data that corresponds to the specific program state P7 and may output the number of fail bits to the garbage collection controller 1222.

Figure 10:
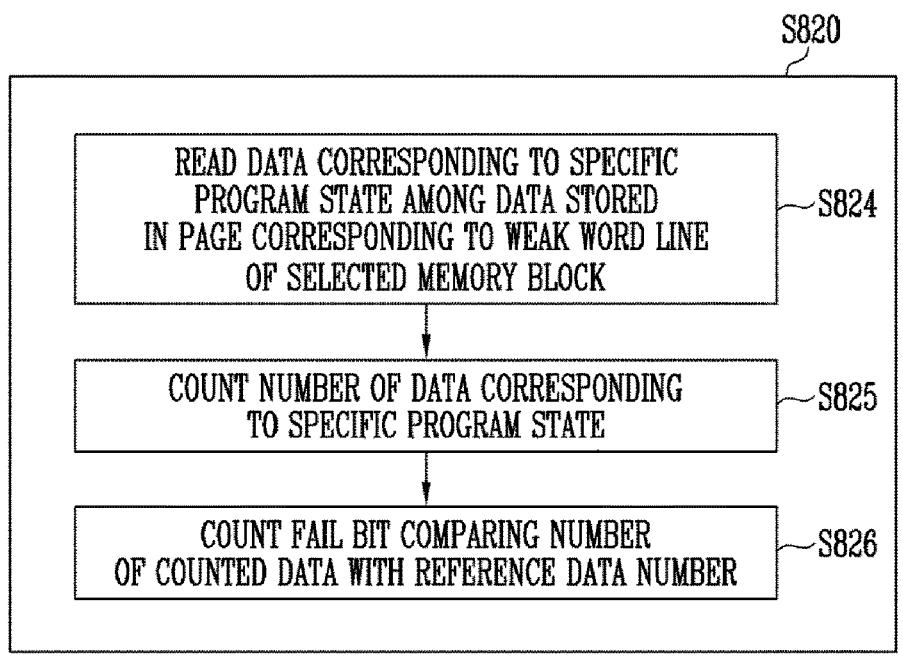
FIG. 10 is a flowchart illustrating another embodiment of step S820 of FIG. 8.

FIG. 10 is a flowchart illustrating another embodiment of step S820 of FIG. 8.

Another embodiment of step S820 is described in more detail with reference to FIGS. 1 to 7 and 10 as follows.

In step S824, each of the plurality of semiconductor memories 100 included in the memory device 1100 may read the data corresponding to a specific program state among data stored in the page, corresponding to the weak word line included in memory blocks on which a program operation has been performed among the plurality of memory blocks BLK1 to BLKz. For example, only data of memory cells with a threshold voltage higher than the read voltage R7 may be selectively read by performing a read operation by using the read voltage R7 of FIG. 7.

In step S825, the control circuit 120 may count the number of data that corresponds to the specific program state P7.

In step S826, the control circuit 120 may compare the number of counted data that corresponds to the specific program state P7 with the set number, and when the number of data that corresponds to the specific program state is less than the set number, the control circuit 120 may count and transmit a difference value between the number of data that corresponds to the specific program state and the set number as the fail bit number to the controller 1200 of FIG. 1. The set number may be ⅛ of the number of memory cells included in one page.

Figure 11:
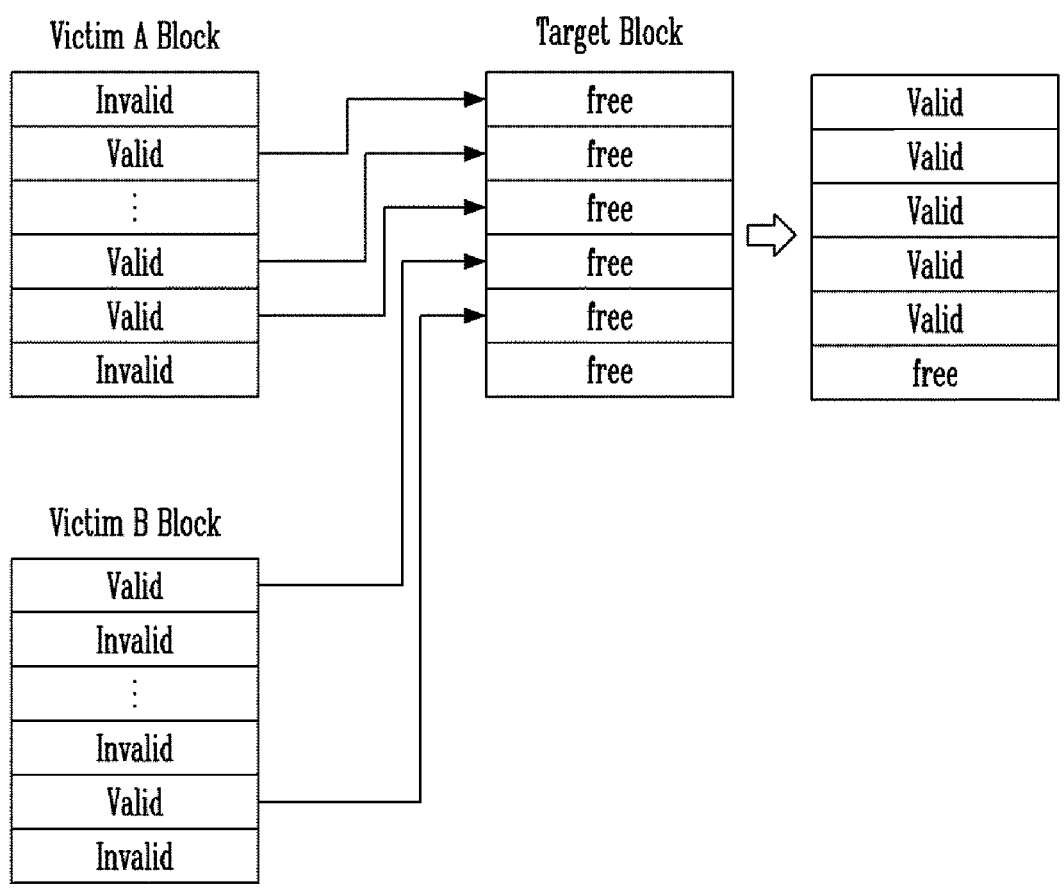
FIG. 11 is a diagram illustrating a garbage collection operation of step S840 of FIG. 8.

FIG. 11 is a diagram illustrating the garbage collection operation of step S840 of FIG. 8.

In an embodiment of the present disclosure, an embodiment in which the garbage collection operation may be performed by storing the valid data of an A victim block Victim A Block and a B victim block Victim B Block of the semiconductor memory in Target Block.

Referring to FIG. 11, a plurality of pages that are included in the A victim block Victim A Block may include pages Valid in which the valid data is stored and pages Invalid in which invalid data is stored. In addition, a plurality of pages that are included in the B victim block Victim B Block may include pages Valid in which the valid data is stored and pages Invalid in which invalid data is stored.

Since the Target Block selects one of free blocks among the memory blocks, the Target Block may be configured of pages of an erase state free in which data is not stored.

During the garbage collection operation, data of the pages Valid in which the valid data is stored among the plurality of pages that are included in the A victim block Victim A Block and the B victim block Victim B Block may be read, and the read data may be transmitted to the error corrector 1240 of FIG. 2. The error corrector 1240 may perform an error correction operation on the received data, and the error corrected data may be stored in the memory buffer 1230. Thereafter, the valid data that is stored in the memory buffer 1230 may be stored in the Target Block in a page unit. That is, the valid data that is stored in the plurality of victim blocks may be copied and stored in the target block. Therefore, all valid data that is stored in the plurality of victim blocks may be stored in the target block of which the number is less than that of the victim blocks.

The A victim block Victim A Block and the B victim block Victim B Block, which store the valid data of the A victim block Victim A Block and the B victim block Victim B Block described above, in the target block, may be erased and become a free block.

Figure 12:
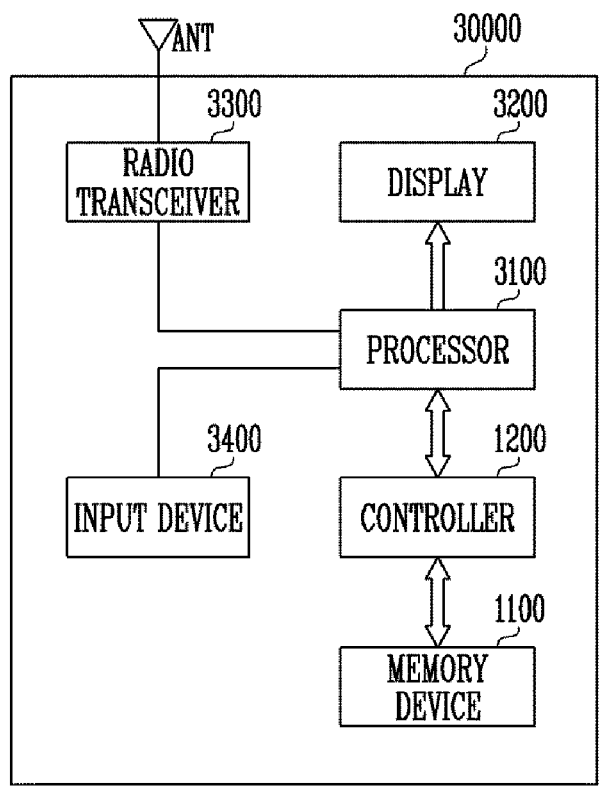
FIG. 12 is a diagram illustrating another embodiment of the memory system.

FIG. 12 is a diagram illustrating another embodiment of the memory system.

Referring to FIG. 12, the memory system 30000 may be implemented as a cellular phone, a smart phone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal that is output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal and output the converted radio signal to an external device through the antenna ANT. An input device 3400 may be a device that is capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data that is output from the controller 1200, data that is output from the radio transceiver 3300, or data output from the input device 3400 may be output through the display 3200.

According to an embodiment, the controller 1200 capable of controlling the operation of memory device 1100 may be implemented as a part of the processor 3100 and may also be implemented as a chip that is separate from the processor 3100. In addition, the controller 1200 may be implemented through an example of the controller shown in FIG. 2.

Figure 13:
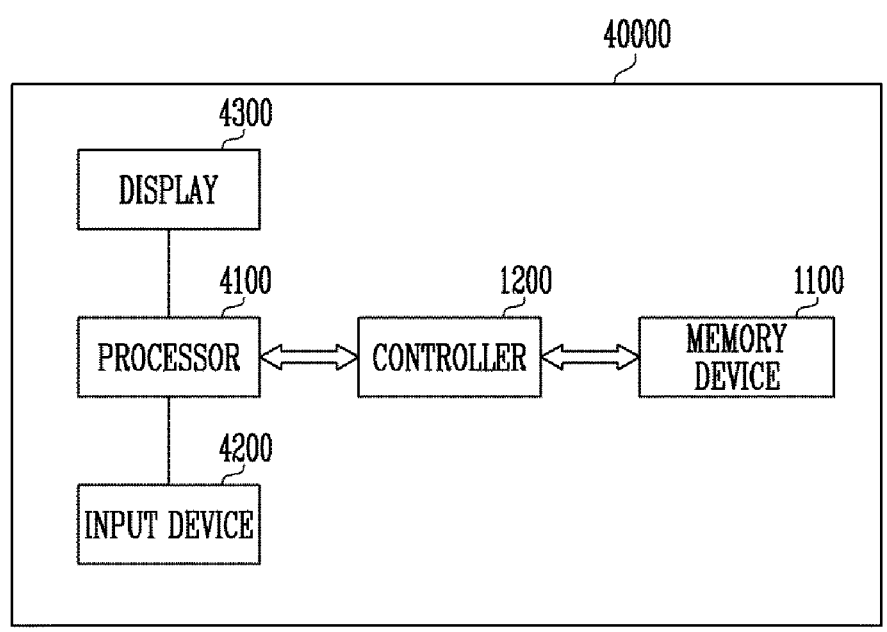
FIG. 13 is a diagram illustrating another embodiment of the memory system.

FIG. 13 is a diagram illustrating another embodiment of the memory system.

Referring to FIG. 13, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 that is capable of controlling a data process operation of the memory device 1100.

A processor 4100 may output data that is stored in the memory device 1100 through a display 4300, according to data that is input through an input device 4200. For example, the input device 4200 may be implemented as a point device, such as a touch pad or a computer mouse, a keypad, or a keyboard.

The processor 4100 may control the overall operation of the memory system 40000 and control the operation of the controller 1200. According to an embodiment, the controller 1200 that is capable of controlling the operation of memory device 1100 may be implemented as a part of the processor 4100 or may be implemented as a chip separate from the processor 4100. In addition, the controller 1200 may be implemented through an example of the controller shown in FIG. 2.

Figure 14:
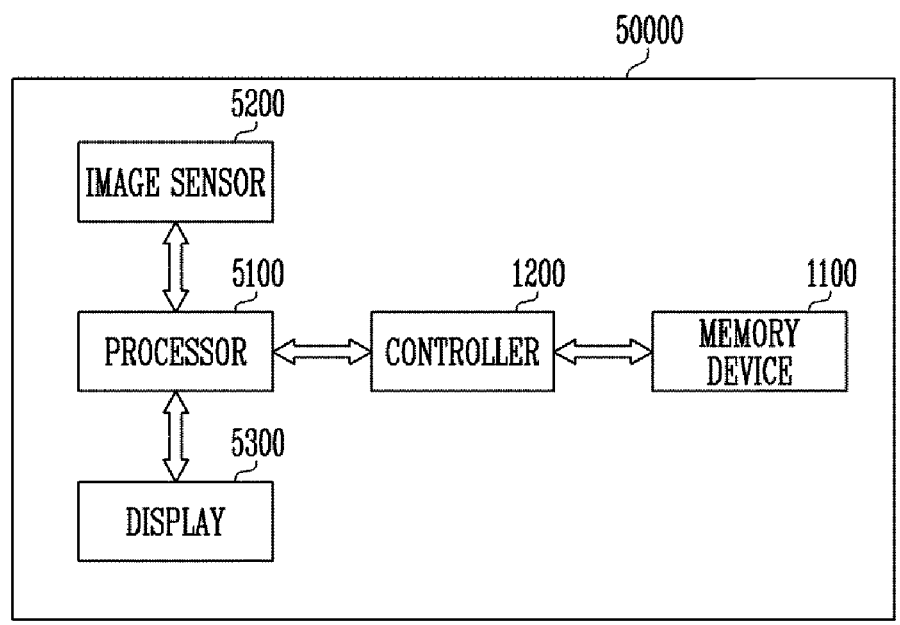
FIG. 14 is a diagram illustrating another embodiment of the memory system.

FIG. 14 is a diagram illustrating another embodiment of the memory system.

Referring to FIG. 14, the memory system 50000 may be implemented as an image processing device, for example, a digital camera, a portable phone provided with a digital camera, a smart phone that is provided with a digital camera, or a tablet PC provided with a digital camera.

The memory system 50000 may include the memory device 1100 and the controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be output through a display 5300 or stored in the memory device 1100 through the controller 1200. In addition, data that is stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip that is separate from the processor 5100. In addition, the controller 1200 may be implemented through an example of the controller shown in FIG. 2.

Figure 15:
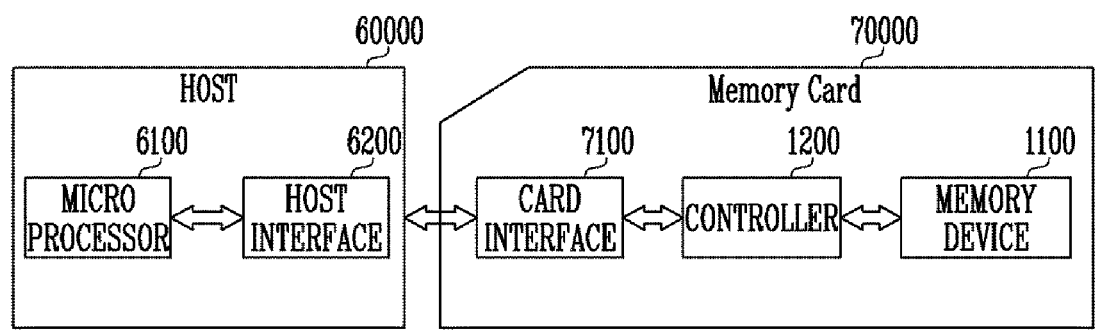
FIG. 15 is a diagram illustrating another embodiment of the memory system.

FIG. 15 is a diagram illustrating another embodiment of the memory system.

Referring to FIG. 15, the memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the controller 1200 may be implemented through an example of the controller shown in FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the present disclosure has been described with reference to the limited embodiments and drawings, the present disclosure is not limited to the embodiments described above, and various changes and modifications are possible from the disclosed description by those skilled in the art to which the present disclosure pertains.

What is claimed is:

1. A memory system comprising:
   a memory device including a plurality of semiconductor memories; and
   a controller for controlling the memory device to select victim blocks among a plurality of memory blocks that are included in each of the plurality of semiconductor memories based on a fail bit number of some data, among data that is programmed in each of the plurality of semiconductor memories, corresponding to a specific program state, and for performing a garbage collection operation on the selected victim blocks,
   wherein the specific program state is at least one program state in which a threshold voltage distribution is relatively high among an erase state and a plurality of program states in which memory cells included in the plurality of semiconductor memories are programmed.

2. The memory system of claim 1, wherein the controller controls the memory device to perform, at every predetermined period, a fail bit check operation that checks the fail bit number of the some data, corresponding to the specific program state.

3. The memory system of claim 1, wherein the controller comprises:
   a garbage collection controller for controlling the garbage collection operation; and
   an error corrector for receiving read data from the memory device, detecting a fail bit of the some data that corresponds to the specific program state among the read data, and counting the detected fail bit to generate the fail bit number.

4. The memory system of claim 3, wherein the garbage collection controller comprises:
   a period setting component for controlling the memory device to set a period and for performing a fail bit check operation every set period;

a fail bit comparator for comparing the fail bit number that is generated by the error corrector with a set number; and a victim block selector for selecting a memory block, among the plurality of memory blocks, of which the fail bit number is greater than the set number as the victim block as a result of the comparison of the fail bit comparator.

5. The memory system of claim 1, wherein the controller comprises a garbage collection controller for controlling the garbage collection operation, and wherein the garbage collection controller comprises:
a period setting component for controlling the memory device to set a period and for performing a fail bit check operation every set period;
a fail bit comparator for receiving the fail bit number from each of the plurality of semiconductor memories and for comparing the fail bit number with a set number; and
a victim block selector for selecting a memory block, among the plurality of memory blocks of which the fail bit number is greater than the set number, as the victim block as a result of the comparison of the fail bit comparator.

6. The memory system of claim 5, wherein each of the plurality of semiconductor memories reads data, among data that is stored in a page that corresponds to a weak word line of a selected memory block, corresponding to the specific program state during the fail bit check operation, and generates the fail bit number based on the number of read data.

7. The memory system of claim 1, wherein the fail bit number is the fail bit number of the some data that is stored in a page, corresponding to a weak word line of the plurality of memory blocks, included in each of the plurality of semiconductor memories.

8. The memory system of claim 7, wherein the weak word line is a word line, among a plurality of word lines connected to the plurality of memory blocks, connected to memory cells of which a channel layer diameter is less than a reference value by a set value or more than the set value or of which the channel layer diameter is greater than the reference value by the set value or more than the set value.

9. A method of operating a memory system, the method comprising:
reading data that is stored in a memory block;
performing a fail bit check operation that detects a fail bit of some data, among the read data, corresponding to a specific program state, and counting a fail bit number;
selecting the memory block as a victim block when the fail bit number is greater than or equal to a set number; and
performing a garbage collection operation on the selected victim block,
wherein the specific program state is at least one program state in which a threshold voltage distribution is relatively high among an erase state and a plurality of program states in which memory cells included in the memory block are programmed.

10. The method of claim 9, wherein the fail bit check operation is performed in a predetermined period interval.

11. The method of claim 9, wherein reading the data that is stored in the memory block comprises reading data that is stored in a page that corresponds to a weak word line, among a plurality of word lines that are connected to the memory block.

12. The method of claim 11, wherein the weak word line is a word line, among the plurality of word lines, connected to memory cells of which a channel layer diameter is less than a reference value by a set value or more than the set value or of which the channel layer diameter is greater than the reference value by the set value or more than the set value.

13. A method of operating a memory system, the method comprising:
reading data of memory cells, among memory cells that are included in a memory block, programmed to a specific program state;
performing a fail bit check operation that counts the number of read data and counts a fail bit number by comparing the number of counted data with a reference number;
selecting the memory block as a victim block when the fail bit number is greater than or equal to a set number; and
performing a garbage collection operation on the selected victim block,
wherein the specific program state is at least one program state in which a threshold voltage distribution is relatively high among an erase state and a plurality of program states in which memory cells included in the memory block are programmed.

14. The method of claim 13, wherein the fail bit check operation is performed at a predetermined period interval.

15. The method of claim 13, wherein reading the data of the memory cells programmed to the specific program state comprises reading the data of the memory cells programmed to the specific program state, among memory cells included in a page corresponding to a weak word line, among a plurality of word lines, connected to the memory block.

16. The method of claim 15, wherein the weak word line is a word line, among the plurality of word lines, connected to memory cells of which a channel layer diameter is less than a reference value by a set value or more than the set value or of which the channel layer diameter is greater than the reference value by the set value or more than the set value.

17. The method of claim 15, wherein the memory cells that are included in the page are programmed in a random program method in which the memory cells are evenly programmed to the erase state and the plurality of program states.

* * * * *